United States Patent
Welch et al.

(10) Patent No.: US 10,243,674 B2
(45) Date of Patent: *Mar. 26, 2019

(54) METHOD AND SYSTEM FOR A DISTRIBUTED OPTOELECTRONIC RECEIVER

(71) Applicant: Luxtera, Inc., Carlsbad, CA (US)

(72) Inventors: Brian Welch, San Diego, CA (US); Gianlorenzo Masini, Carlsbad, CA (US)

(73) Assignee: Luxtera, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/977,835

(22) Filed: May 11, 2018

(65) Prior Publication Data

US 2018/0262275 A1 Sep. 13, 2018

Related U.S. Application Data

(63) Continuation of application No. 15/356,010, filed on Nov. 18, 2016, now Pat. No. 9,973,282.

(Continued)

(51) Int. Cl.
*H03F 3/08* (2006.01)
*H03G 3/30* (2006.01)
(Continued)

(52) U.S. Cl.
CPC ........... *H04B 10/693* (2013.01); *H03F 3/085* (2013.01); *H03G 3/3084* (2013.01); *H03H 21/0012* (2013.01); *H04B 10/80* (2013.01)

(58) Field of Classification Search
CPC ...................................... H04B 10/60–10/6973
See application file for complete search history.

(56) References Cited

U.S. PATENT DOCUMENTS

2003/0081291 A1* 5/2003 Nishimura ......... H04B 10/2507
398/147
2003/0099021 A1* 5/2003 Heineke ................ H04B 10/69
398/202

(Continued)

FOREIGN PATENT DOCUMENTS

WO 2009096918 8/2009

OTHER PUBLICATIONS

Search Report corresponding to Singapore Patent Application No. 10201609714P, completed Jun. 9, 2017.

(Continued)

*Primary Examiner* — Casey L Kretzer
(74) *Attorney, Agent, or Firm* — McAndrews, Held & Malloy

(57) ABSTRACT

Methods and systems for a distributed optoelectronic receiver are disclosed and may include an optoelectronic receiver having a grating coupler, a splitter, a plurality of photodiodes, and a plurality of transimpedance amplifiers (TIAs). The receiver receives a modulated optical signal utilizing the grating coupler, splits the received signal into a plurality of optical signals, generates a plurality of electrical signals from the plurality of optical signals utilizing the plurality of photodiodes, communicates the plurality of electrical signals to the plurality of TIAs, amplifies the plurality of electrical signals utilizing the plurality of TIAs, and generates an output electrical signal from coupled outputs of the plurality of TIAs. Each TIA may be configured to amplify signals in a different frequency range. One of the plurality of electrical signals may be DC coupled to a low frequency TIA of the plurality of TIAs.

18 Claims, 11 Drawing Sheets

Related U.S. Application Data

(60) Provisional application No. 62/386,159, filed on Nov. 18, 2015.

(51) Int. Cl.
*H03H 21/00* (2006.01)
*H04B 10/69* (2013.01)
*H04B 10/80* (2013.01)

(56) References Cited

U.S. PATENT DOCUMENTS

| | | | |
|---|---|---|---|
| 2006/0076473 A1 | 4/2006 | Wilcken et al. | |
| 2008/0199190 A1 | 8/2008 | Hakomori et al. | |
| 2009/0087197 A1 | 4/2009 | Welch | |
| 2010/0046965 A1* | 2/2010 | Shioiri | H04B 10/677 398/204 |
| 2011/0170874 A1* | 7/2011 | Sakuramoto | H04B 10/564 398/140 |
| 2011/0255866 A1* | 10/2011 | Van Veen | H04B 10/07955 398/35 |
| 2012/0082460 A1 | 4/2012 | Wu et al. | |
| 2013/0294782 A1* | 11/2013 | Liboiron-Ladouceur | H04B 10/616 398/202 |
| 2014/0212150 A1 | 7/2014 | Welch et al. | |
| 2014/0255042 A1 | 9/2014 | Kaikkonen et al. | |
| 2015/0288455 A1* | 10/2015 | Legare-Vallee | H04L 25/20 398/201 |
| 2015/0312064 A1* | 10/2015 | Bulzacchelli | H04L 25/03057 375/233 |

OTHER PUBLICATIONS

Extended European Search Report corresponding to European Patent Application No. 16199632.7-1874, dated Apr. 12, 2017.

* cited by examiner

METHOD AND SYSTEM FOR A DISTRIBUTED OPTOELECTRONIC RECEIVER

REFERENCE

This application is a continuation of application Ser. No. 15/356,010 filed on Nov. 18, 2016, which claims priority to and the benefit of U.S. Provisional Application 62/386,159 filed on Nov. 18, 2015, which is hereby incorporated herein by reference in its entirety.

FIELD

Certain embodiments of the disclosure relate to semiconductor photonics. More specifically, certain embodiments of the disclosure relate to a method and system for a multi-level encoded data path with decoder.

BACKGROUND

As data networks scale to meet ever-increasing bandwidth requirements, the shortcomings of copper data channels are becoming apparent. Signal attenuation and crosstalk due to radiated electromagnetic energy are the main impediments encountered by designers of such systems. They can be mitigated to some extent with equalization, coding, and shielding, but these techniques require considerable power, complexity, and cable bulk penalties while offering only modest improvements in reach and very limited scalability. Free of such channel limitations, optical communication has been recognized as the successor to copper links.

Further limitations and disadvantages of conventional and traditional approaches will become apparent to one of skill in the art, through comparison of such systems with the present disclosure as set forth in the remainder of the present application with reference to the drawings.

BRIEF SUMMARY

A system and/or method for a distributed optoelectronic receiver, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Certain aspects of the disclosure may be found in a method and system for a distributed optoelectronic receiver. Exemplary aspects of the disclosure may comprise in an optoelectronic receiver with a grating coupler, a splitter, a plurality of photodiodes, and a plurality of transimpedance amplifiers (TIAs): receiving a modulated optical signal utilizing the grating coupler, splitting the received signal into a plurality of optical signals, generating a plurality of electrical signals from the plurality of optical signals utilizing the plurality of photodiodes, communicating the plurality of electrical signals to the plurality of TIAs, amplifying the plurality of electrical signals utilizing the plurality of TIAs, and generating an output electrical signal from coupled outputs of the plurality of TIAs. Each TIA may be configured to amplify signals in a different frequency range. One of the plurality of electrical signals may be DC coupled to a low frequency TIA of the plurality of TIAs. One of the plurality of electrical signals may be AC coupled to a high frequency TIA of the plurality of TIAs. The TIAs may each have feedback impedances for configuring a frequency range of operation of each TIA. The photodiodes may be differentially coupled to the plurality of TIAs. Optical continuous linear equalization (CTLE) may be performed by configuring gain levels of each of the TIAs. Optical frequencies of the received signal may be discriminated based on magnitudes of output signals from each of the plurality of TIAs. The received signal may be filtered in a finite impulse response (FIR) filter including the photodiodes, TIAs, and a plurality of optical delay elements. The optoelectronic receiver may be on a semiconductor die. The semiconductor die may be a silicon complementary-metal oxide semiconductor (CMOS) photonics die.

Figure 1A:
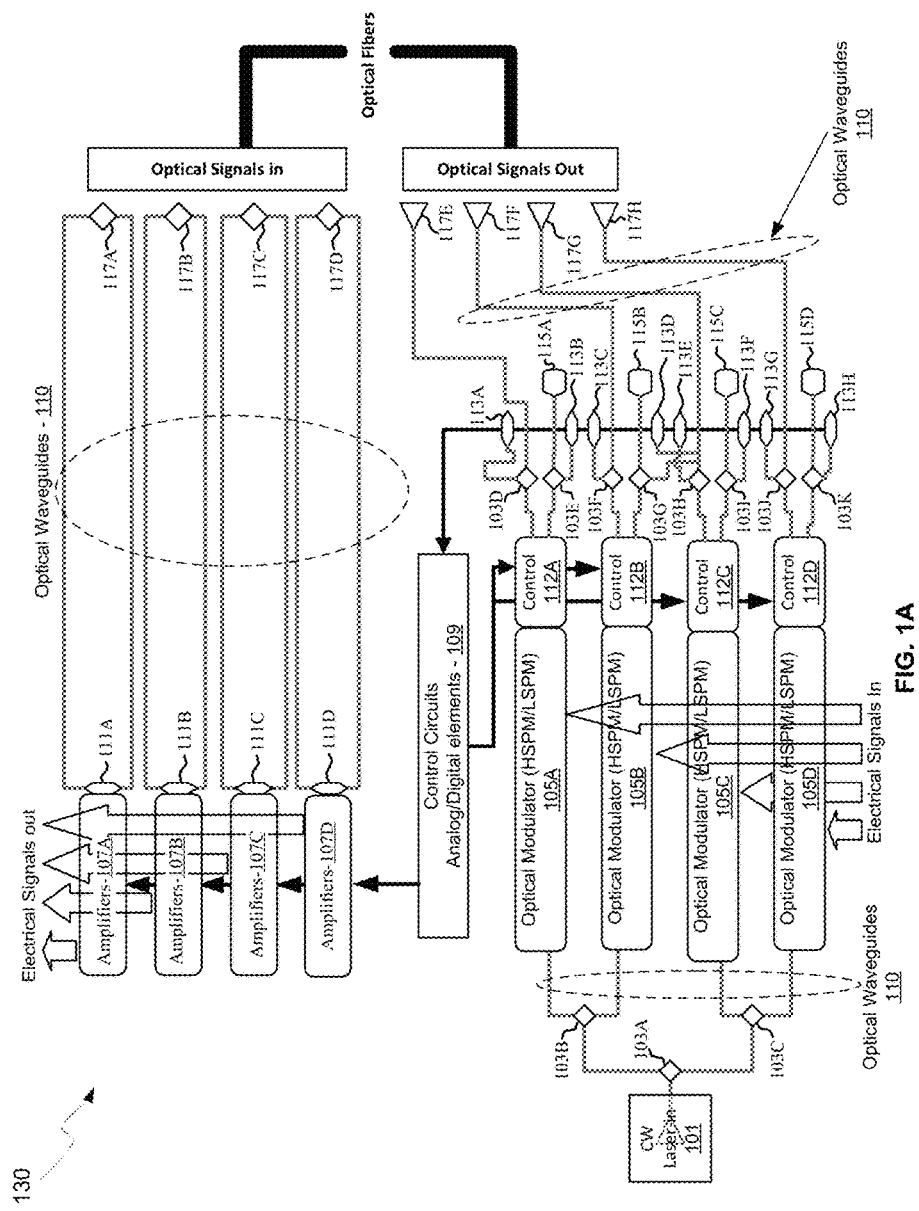
FIG. 1A is a block diagram of a photonically-enabled integrated circuit with a distributed optoelectronic receiver, in accordance with an example embodiment of the disclosure.

FIG. 1A is a block diagram of a photonically-enabled integrated circuit with a distributed optoelectronic receiver, in accordance with an example embodiment of the disclosure. Referring to FIG. 1A, there are shown optoelectronic devices on a photonically-enabled integrated circuit 130 comprising optical modulators 105A-105D, photodiodes 111A-111D, monitor photodiodes 113A-113H, and optical devices comprising couplers 103A-103K, optical terminations 115A-115D, and grating couplers 117A-117H. There are also shown electrical devices and circuits comprising amplifiers 107A-107D, analog and digital control circuits 109, and control sections 112A-112D. The amplifiers 107A-107D may comprise transimpedance and limiting amplifiers (TIA/LAs), for example.

In an example scenario, the photonically-enabled integrated circuit 130 comprises a CMOS photonics die with a laser assembly 101 coupled to the top surface of the IC 130. The laser assembly 101 may comprise one or more semiconductor lasers with isolators, lenses, and/or rotators for directing one or more CW optical signals to the coupler 103A.

Optical signals are communicated between optical and optoelectronic devices via optical waveguides 110 fabricated in the photonically-enabled integrated circuit 130. Single-mode or multi-mode waveguides may be used in photonic integrated circuits. Single-mode operation enables direct connection to optical signal processing and networking elements. The term "single-mode" may be used for waveguides that support a single mode for each of the two polarizations, for example transverse-electric (TE) and transverse-magnetic (TM), or for waveguides that are truly single mode and only support one mode whose polarization is, for example, TE, which comprises an electric field parallel to the substrate supporting the waveguides. Two typical waveguide cross-sections that are utilized comprise strip waveguides and rib waveguides. Strip waveguides typically comprise a rectangular cross-section, whereas rib waveguides comprise a rib section on top of a waveguide slab. Of course, other waveguide cross section types are also contemplated and within the scope of the disclosure.

In an example scenario, the couplers 103A-103C may comprise low-loss Y-junction power splitters where coupler 103A receives an optical signal from the laser assembly 101 and splits the signal to two branches that direct the optical signals to the couplers 103B and 103C, which split the optical signal once more, resulting in four roughly equal power optical signals.

The optical modulators 105A-105D comprise Mach-Zehnder or ring modulators, for example, and enable the modulation of the continuous-wave (CW) laser input signal. The optical modulators 105A-105D may comprise high-speed and low-speed phase modulation sections and are controlled by the control sections 112A-112D. The high-speed phase modulation section of the optical modulators 105A-105D may modulate a CW light source signal with a data signal. The low-speed phase modulation section of the optical modulators 105A-105D may compensate for slowly varying phase factors such as those induced by mismatch between the waveguides, waveguide temperature, or waveguide stress and is referred to as the passive phase, or the passive biasing of the MZI.

The outputs of the optical modulators 105A-105D may be optically coupled via the waveguides 110 to the grating couplers 117E-117H. The couplers 103D-103K may comprise four-port optical couplers, for example, and may be utilized to sample or split the optical signals generated by the optical modulators 105A-105D, with the sampled signals being measured by the monitor photodiodes 113A-113H. The unused branches of the directional couplers 103D-103K may be terminated by optical terminations 115A-115D to avoid back reflections of unwanted signals.

The grating couplers 117A-117H comprise optical gratings that enable coupling of light into and out of the photonically-enabled integrated circuit 130. The grating couplers 117A-117D may be utilized to couple light received from optical fibers into the photonically-enabled integrated circuit 130, and the grating couplers 117E-117H may be utilized to couple light from the photonically-enabled integrated circuit 130 into optical fibers. The grating couplers 117A-117H may comprise single polarization grating couplers (SPGC) and/or polarization splitting grating couplers (PSGC). In instances where a PSGC is utilized, two input, or output, waveguides may be utilized.

The optical fibers may be epoxied, for example, to the CMOS chip, and may be aligned at an angle from normal to the surface of the photonically-enabled integrated circuit 130 to optimize coupling efficiency. In an example embodiment, the optical fibers may comprise single-mode fiber (SMF) and/or polarization-maintaining fiber (PMF).

Figure 1B:
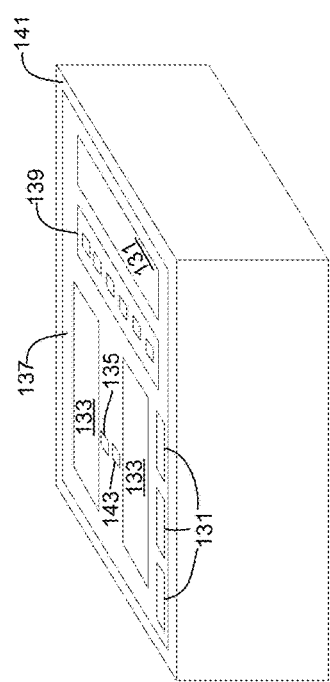
FIG. 1B is a diagram illustrating an exemplary photonically-enabled integrated circuit, in accordance with an exemplary embodiment of the disclosure.

In another exemplary embodiment illustrated in FIG. 1B, optical signals may be communicated directly into the surface of the photonically-enabled integrated circuit 130 without optical fibers by directing a light source on an optical coupling device in the chip, such as the light source interface 135 and/or the optical fiber interface 139. This may be accomplished with directed laser sources and/or optical sources on another chip flip-chip bonded to the photonically-enabled integrated circuit 130.

The photodiodes 111A-111D may convert optical signals received from the grating couplers 117A-117D into electrical signals that are communicated to the amplifiers 107A-107D for processing. In another exemplary embodiment of the disclosure, the photodiodes 111A-111D may comprise high-speed heterojunction phototransistors, for example, and may comprise germanium (Ge) in the collector and base regions for absorption in the 1.3-1.6 μm optical wavelength range, and may be integrated on a CMOS silicon-on-insulator (SOI) wafer. In an example scenario, each of the photodiodes 111A-111D may comprise a pair of photodiodes with splitters at the inputs so that each receives the optical signals from the optical waveguides 110 from a single PSGC 117A-117D.

The analog and digital control circuits 109 may control gain levels or other parameters in the operation of the amplifiers 107A-107D, which may then communicate electrical signals off the photonically-enabled integrated circuit 130. The control sections 112A-112D comprise electronic circuitry that enable modulation of the CW laser signal received from the splitters 103A-103C. The optical modulators 105A-105D may require high-speed electrical signals to modulate the refractive index in respective branches of a Mach-Zehnder interferometer (MZI), for example. The amplifiers 107A-107D may comprise parallel receiver paths with separate photodiodes and TIAs, each path tuned to a different frequency range such that one may receive and amplify low frequencies and the other for high frequencies, with the electrical outputs combined to result in a desired wide frequency response. Conventional optoelectronic receivers are configured for low and high frequency ranges. Optimizing each path of the receiver around a specific portion of the frequency spectrum may result in improved receiver sensitivity and improved frequency response (even down to DC). Such a structure may be used as an optical continuous time linear equalizer or an optical frequency discriminator, for example.

In operation, the photonically-enabled integrated circuit 130 may be operable to transmit and/or receive and process optical signals. Optical signals may be received from optical fibers by the grating couplers 117A-117D and converted to electrical signals by the photodetectors 111A-111D. The electrical signals may be amplified by transimpedance amplifiers in the amplifiers 107A-107D, for example, with parallel high and low frequency paths that are summed electrically, and subsequently communicated to other electronic circuitry, not shown, in the photonically-enabled integrated circuit 130.

FIG. 1B is a diagram illustrating an exemplary photonically-enabled integrated circuit, in accordance with an exemplary embodiment of the disclosure. Referring to FIG. 1B, there is shown the photonically-enabled integrated circuit 130 comprising electronic devices/circuits 131, optical and optoelectronic devices 133, a light source interface 135, a chip front surface 137, an optical fiber interface 139, CMOS guard ring 141, and a surface-illuminated monitor photodiode 143.

The light source interface 135 and the optical fiber interface 139 comprise grating couplers, for example, that enable coupling of light signals via the CMOS chip surface 137, as opposed to the edges of the chip as with conventional edge-emitting/receiving devices. Coupling light signals via the chip surface 137 enables the use of the CMOS guard ring 141 which protects the chip mechanically and prevents the entry of contaminants via the chip edge.

The electronic devices/circuits 131 comprise circuitry such as the amplifiers 107 and the analog and digital control circuits 109 described with respect to FIG. 1A, for example. The optical and optoelectronic devices 133 comprise devices such as the couplers 103A-103K, optical couplers 104, optical terminations 115A-115D, grating couplers 117A-117H, optical modulators 105A-105D, high-speed heterojunction photodiodes 111A-111D, and monitor photodiodes 113A-113I.

In an example scenario, the optical and electronic devices comprise distributed receivers with parallel paths tuned to different frequency ranges and comprising separate photodiodes coupled to splitters to provide an optical signals to each photodiode.

Figure 1C:
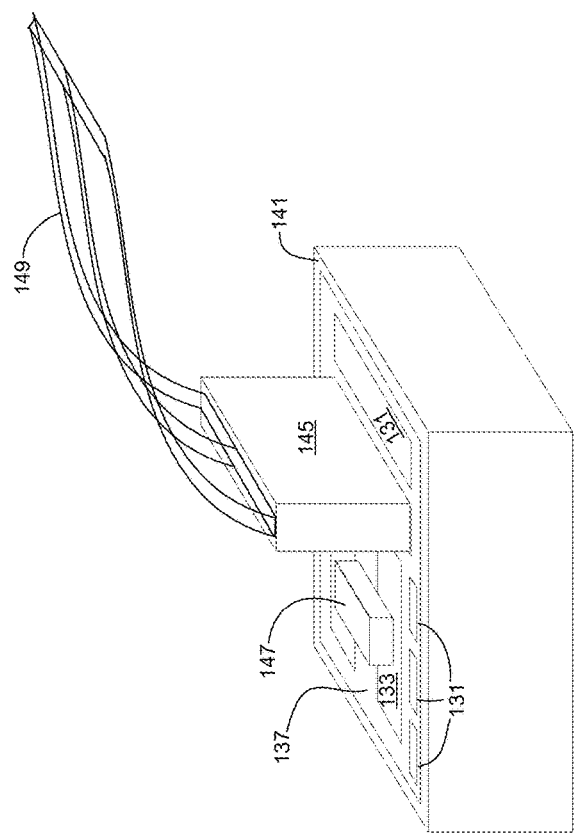
FIG. 1C is a diagram illustrating a photonically-enabled integrated circuit coupled to an optical fiber cable, in accordance with an example embodiment of the disclosure.

FIG. 1C is a diagram illustrating a photonically-enabled integrated circuit coupled to an optical fiber cable, in accordance with an example embodiment of the disclosure. Referring to FIG. 1C, there is shown the photonically-enabled integrated circuit 130 comprising the chip surface 137, and the CMOS guard ring 141. There is also shown a fiber-to-chip coupler 145, an optical fiber cable 149, and an optical source assembly 147.

The photonically-enabled integrated circuit 130 comprising the electronic devices/circuits 131, the optical and optoelectronic devices 133, the light source interface 135, the chip surface 137, and the CMOS guard ring 141 may be as described with respect to FIG. 1B, for example.

In an example embodiment, the optical fiber cable may be affixed, via epoxy for example, to the CMOS chip surface 137. The fiber chip coupler 145 enables the physical coupling of the optical fiber cable 149 to the photonically-enabled integrated circuit 130.

Figure 2:
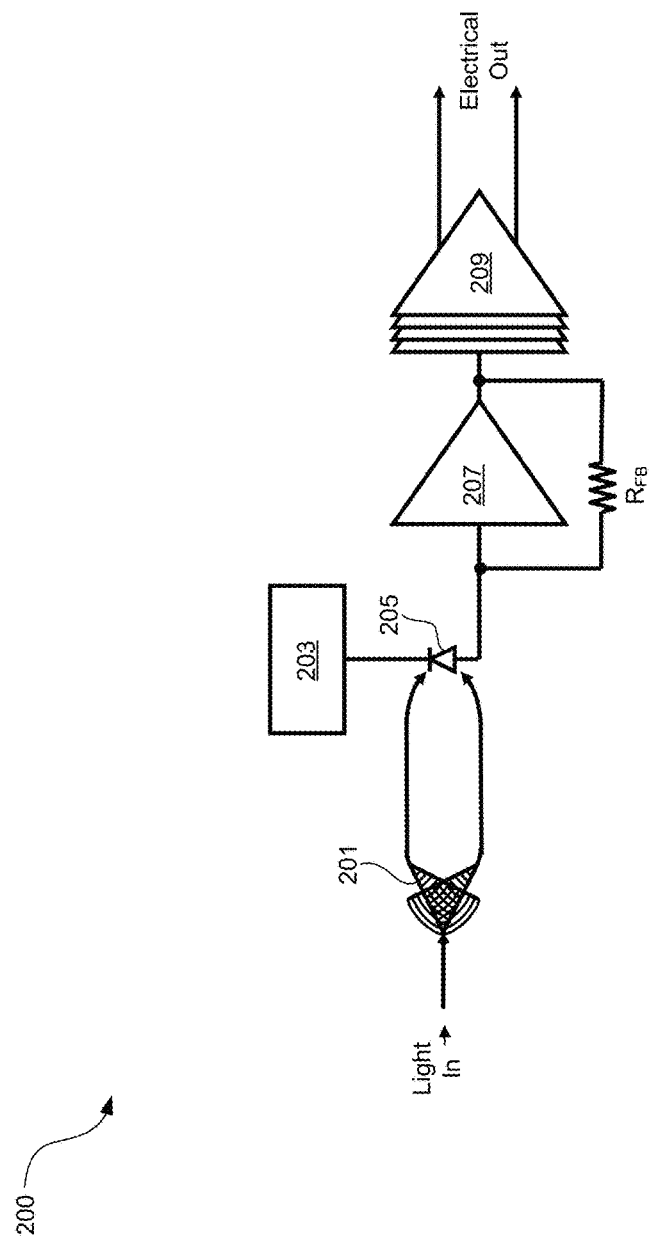
FIG. 2 illustrates an optoelectronic receiver with a feedback transimpedance amplifier, in accordance with an example embodiment of the disclosure.

FIG. 2 illustrates an optoelectronic receiver with a feedback transimpedance amplifier, in accordance with an example embodiment of the disclosure. Referring to FIG. 2, there is shown a receiver 200 comprising a polarization splitting grating coupler (PSGC) 201, a photodiode 205, bias control 203, a transimpedance amplifier 207 with feedback resistor $R_{FB}$, and gain stages 209.

There is also shown an input optical signal, Light In, and an output electrical signal, Electrical Out. The PSGC 201 comprises two overlapped arrays of scattering structures, such as waveguides at angles and spacing configured based on the optical signal wavelength and angle of incidence, for example. The PSGC 201 may receive an optical signal from a near perpendicular angle to the surface of the die and communicate signals to each of the outputs that provide the optical signals to the photodiode 205.

The bias control 203 may comprise a regulated voltage/current source for biasing the photodiode 205. The photodiode may comprise silicon or germanium, or alloys there between, for receiving an optical signal and converting it to an electrical signal. The photodiode may be reverse biased, or alternatively biased near zero-bias, and may be coupled to an input of the TIA 207 with gain-bandwidth configured by the feedback resistance RFB. An input current to the TIA 207 generates an output voltage that may be coupled to the gain stages 209, which may be operable to provide further gain to the signal, and may also convert the received single-ended input signal to a differential output signal.

Figure 3:
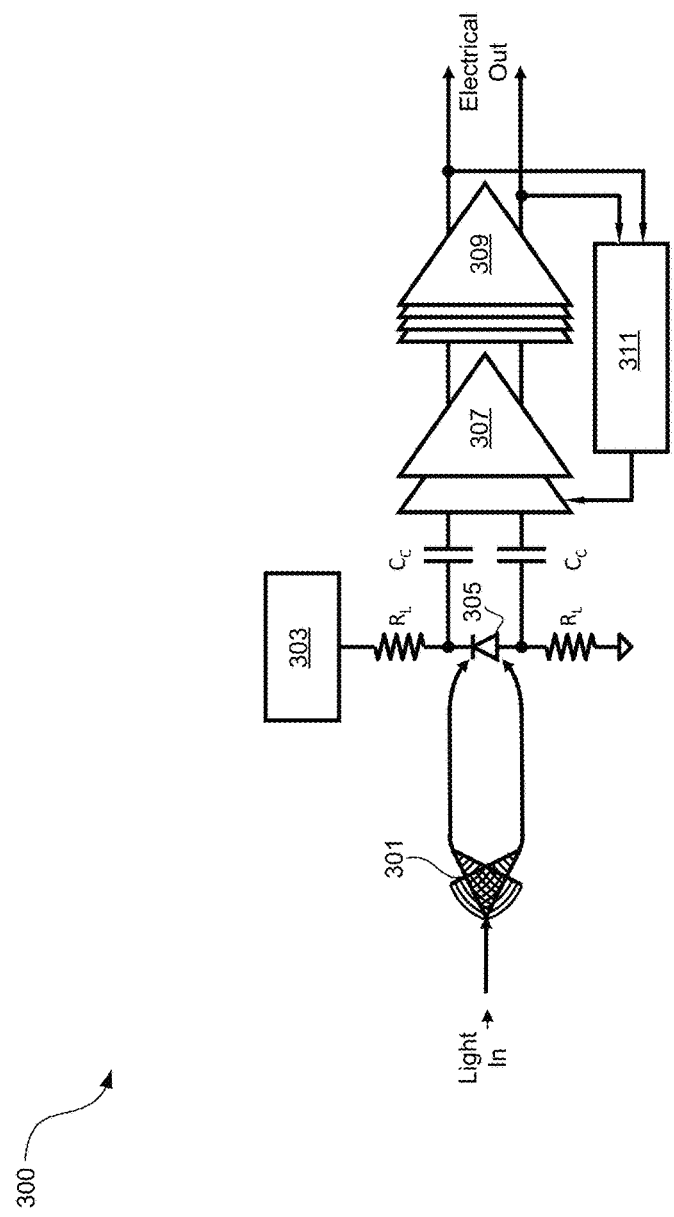
FIG. 3 illustrates an optoelectronic receiver with a differential transimpedance amplifier, in accordance with an example embodiment of the disclosure.

FIG. 3. illustrates an optoelectronic receiver with a differential transimpedance amplifier, in accordance with an example embodiment of the disclosure. Referring to FIG. 3, there is shown a receiver 300 comprising a polarization splitting grating coupler (PSGC) 301, a photodiode 305, bias control 303, a differential transimpedance amplifier 307 with DC offset cancellation 311, and gain stages 309.

There is also shown an input optical signal, Light In, and an output electrical signal, Electrical Out. The PSGC 301 comprises two overlapped arrays of scattering structures, such as waveguides at angles and spacing configured based on the optical signal wavelength and angle of incidence, for example. The PSGC 301 may receive an optical signal from a near perpendicular angle to the surface of the die and communicate signals to each of the outputs that provide the optical signals to the photodiode 305.

The bias control 303 may comprise a voltage/current source for biasing the photodiode 305. The photodiode may comprise silicon or germanium, or alloys there between, for receiving an optical signal and converting it to an electrical signal. The photodiode 305 may be reverse biased, or alternatively biased near zero-bias, and may be AC-coupled in a differential fashion to inputs of the differential TIA 307 via the coupling capacitors $C_C$. The DC offset cancellation 311 may comprise circuitry, logic, and/or code for configuring the DC offset at the outputs of the gain stages 309 at a desired value, i.e., at a minimum.

Input currents to the TIA 307 generate a differential output voltage that may be coupled to the gain stages 309, which may be operable to provide further gain to the signal, generating the output electrical signal, Electrical Out.

Figure 4:
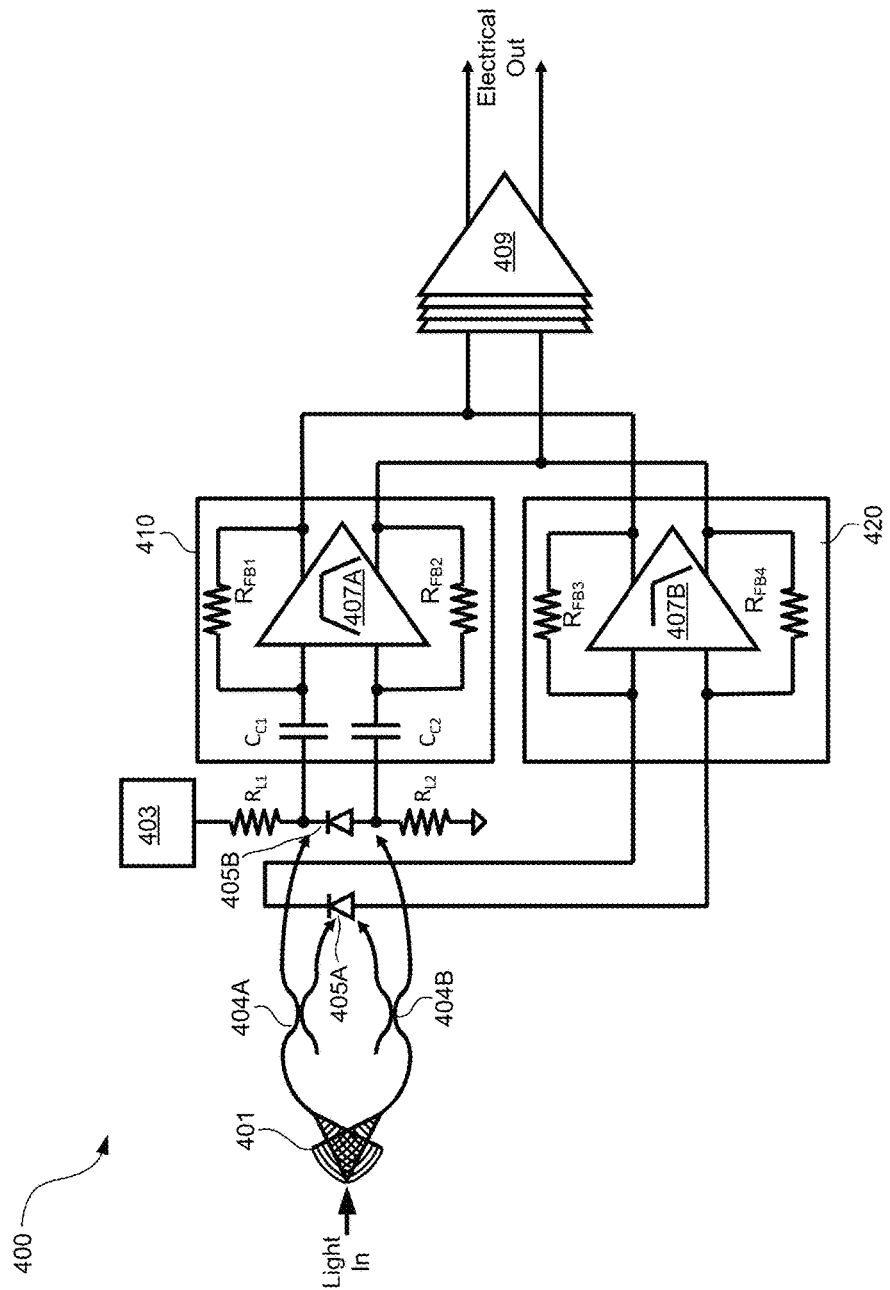
FIG. 4 illustrates a distributed optoelectronic receiver, in accordance with an example embodiment of the disclosure.

FIG. 4 illustrates a distributed optoelectronic receiver, in accordance with an example embodiment of the disclosure. Referring to FIG. 4, there is shown a receiver 400 comprising a polarization splitting grating coupler (PSGC) 401, optical splitters 404A and 404B, load resistors $R_{L1}$ and $R_{L2}$, coupling capacitors $C_{C1}$ and $C_{C2}$, photodiodes 405A and 405B, bias control 403, a high frequency TIA 410, a low frequency TIA 420, and gain stages 409. The high frequency TIA 410 comprises a differential transimpedance amplifier 407A and feedback resistors $R_{FB1}$ and $R_{FB2}$, while low frequency TIA 420 comprises a differential transimpedance amplifier 407B and feedback resistors $R_{FB3}$ and $R_{FB4}$.

There is also shown an input optical signal, Light In, and an output electrical signal, Electrical Out. The PSGC 401 comprises two overlapped arrays of scattering structures, such as waveguides at angles and spacing configured based on the optical signal wavelength and angle of incidence, for example. The PSGC 401 may receive an optical signal from a near perpendicular angle to the surface of the die and communicate signals to each of the outputs that provide the optical signals to the splitters 404A and 404B.

The bias control 403 may comprise a voltage/current source for biasing the photodiodes 405A and 405B. The photodiodes 405A and 405B may comprise silicon or germanium, or alloys there between, for receiving optical signals and converting them to electrical signals. The photodiodes 405A or 405B may be reverse biased, or alternatively biased near zero-bias, and may be AC-coupled in a differential fashion to inputs of the differential TIA 407A via the coupling capacitors $C_{C1}$ and $C_{C2}$. Since the high frequency TIA 410 is operable to amplify high frequency signals and not DC and low frequency signals, the signals are AC-coupled to the TIA as opposed to TIA 420, which is a low frequency TIA and is thus directly coupled to the photodiode 405A.

Input currents to the TIAs 410 and 420 generate differential output voltages that may be coupled to the gain stages 409, which may be operable to provide further gain to the signal, generating the output electrical signal, Electrical Out. The electrical combining of the outputs of the TIA 410 and 420, which operate over different frequency ranges, enables the processing of a wider frequency range with separately configurable gain levels in each TIA. In addition, each photodiode 405A and 405B may be biased differently for optimized performance at the desired frequency.

The feedback resistors $R_{FB1}$-$R_{FB4}$ and coupling capacitors $C_{C1}$ and $C_{C2}$, or lack of coupling capacitors for DC coupling of to the low frequency TIA 420, may enable tuning the frequency response of the TIAs. The feedback resistors may comprise configurable resistance values, such as an addressable array of resistors, for example. In another example scenario, the feedback resistors may comprise active devices with configurable impedance values, such as CMOS transistors biased in the linear region, for example.

In addition, the couplers 404A and 404B may be configured to control the relative intensities of the optical signals coupled to the photodiodes 405A and 405B such that a higher intensity optical signal may be coupled to one of the TIAs as compared to the other, which configures the frequency response of the output electrical signal. It should be noted that the number of receiver paths in FIG. 4 is only an example. Accordingly, any number of paths with configurable frequencies may be utilized to provide any desired overall frequency response.

In operation, optical signals may be coupled into the die comprising the distributed optoelectronic receiver 400 via the PSGC 401, where optical signals of different polarization generated by the PSGC 401 may be split by the optical splitters 404A and 404B. Accordingly, a portion of each of the coupled signals may be coupled to each terminal of the photodiodes 405A and 405B in a differential fashion. The photodiodes 405A and 405B then generate electrical signals proportional to the received optical signals, the electrical signals then being AC coupled to the high frequency TIA 410 and DC coupled to the low frequency TIA 420. The feedback resistors $R_{FB1}$-$R_{FB4}$ configure the gain level of the TIAs 407A and 407B, with the amplified signals combined electrically by the common outputs of the TIAs 407A and 407B.

With gain provided at high frequencies by the high frequency TIA 410 and gain provided at low frequencies by the low frequency TIA 420, a flat, or other desired shape, response may be provided across a wide frequency range without excessively stringent requirements on a single stage. The gain stages 409 may provide further amplification in generating the output signal Electrical Out.

Figure 5:
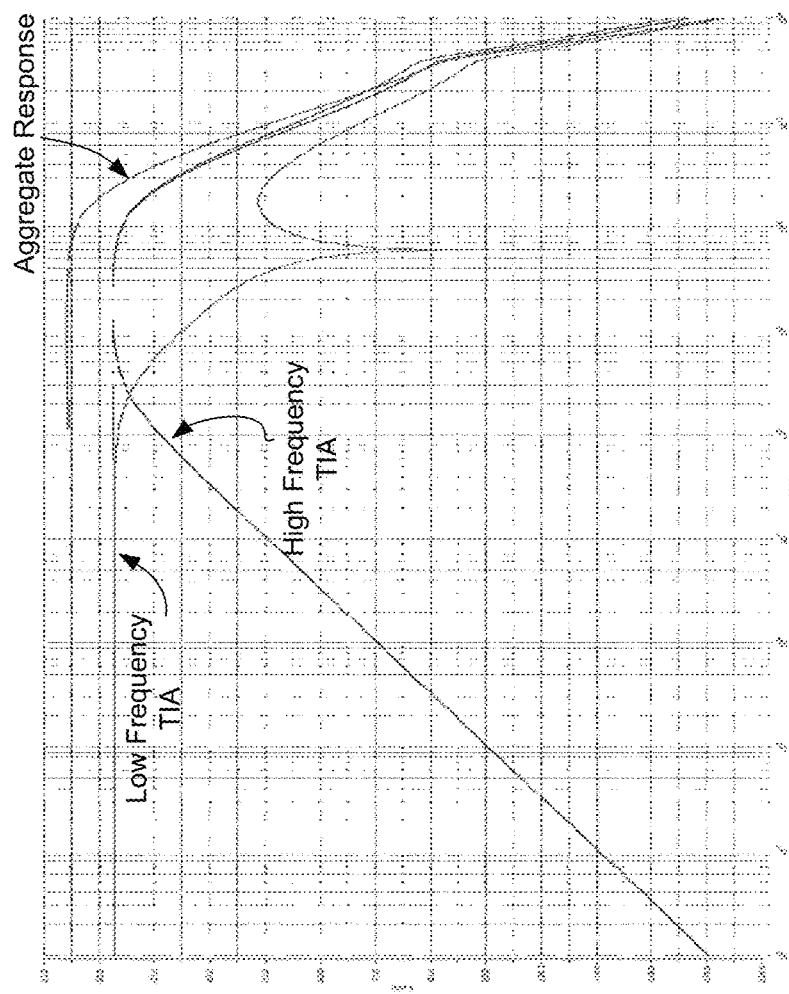
FIG. 5 illustrates the frequency response of a distributed optoelectronic receiver, in accordance with an example embodiment of the disclosure.

FIG. 5 illustrates the frequency response of a distributed optoelectronic receiver, in accordance with an example embodiment of the disclosure. Referring to FIG. 5 there is shown simulated response curves for a low frequency TIA, a high frequency TIA, and the aggregate response from a distributed TIA comprising both the low and high frequency TIAs. As can be seen from the plot, the low frequency TIA provides flat gain from DC up to a roll off frequency that depends on the feedback circuit and other device characteristics of the TIA. Similarly, the high frequency TIA provides a relatively flat gain at high frequencies but then drops off at lower frequencies, as well as at higher frequencies.

Accordingly, utilizing both a low frequency TIA and a high frequency TIA, as shown in FIG. 4, results in the Aggregate Response curve shown in FIG. 5, where the frequency response is flat from DC up to the upper roll over frequency of the high frequency TIA.

Figure 6:
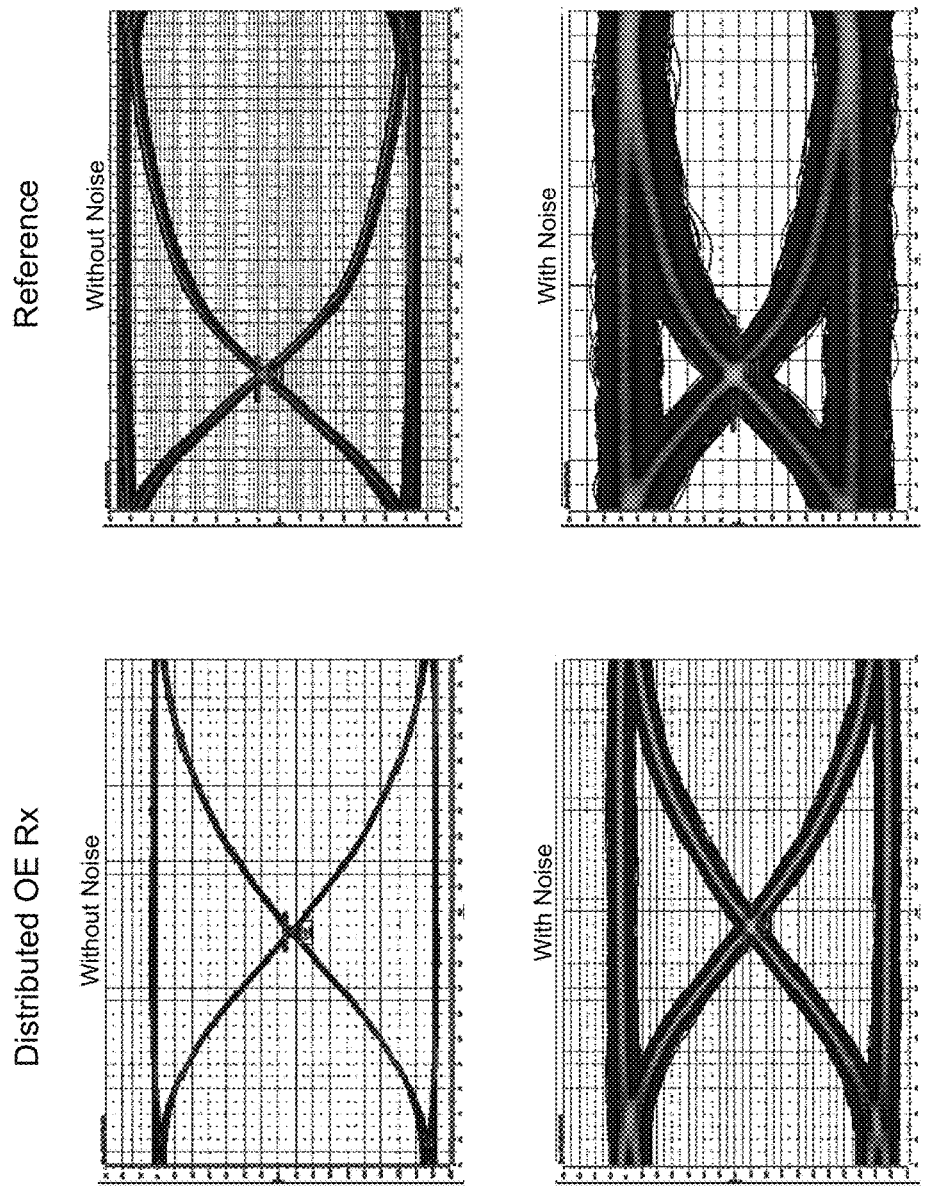
FIG. 6 illustrates eye patterns for a distributed optoelectronic receiver and a reference, in accordance with an example embodiment of the disclosure.

FIG. 6 illustrates eye patterns for a distributed optoelectronic receiver and a reference, in accordance with an example embodiment of the disclosure. Referring to FIG. 6, there are shown eye patterns with and without noise for a distributed optoelectronic receiver on the left and a reference TIA with no feedback on the right. As can be seen from the patterns, the distributed OE receiver eye patterns are much cleaner than the reference, indicating the advantages of the distributed receiver architecture. The eye diagrams shown in FIG. 6 are supportive of the AC response curves of FIG. 5. The distributed OE receiver patterns show that there is no low frequency distortion or jitter, as compared to the reference, indicating the low jitter may be relevant. A bit length of ~60k was utilized to indicate that there is enough low frequency content in the signal.

Figure 7:
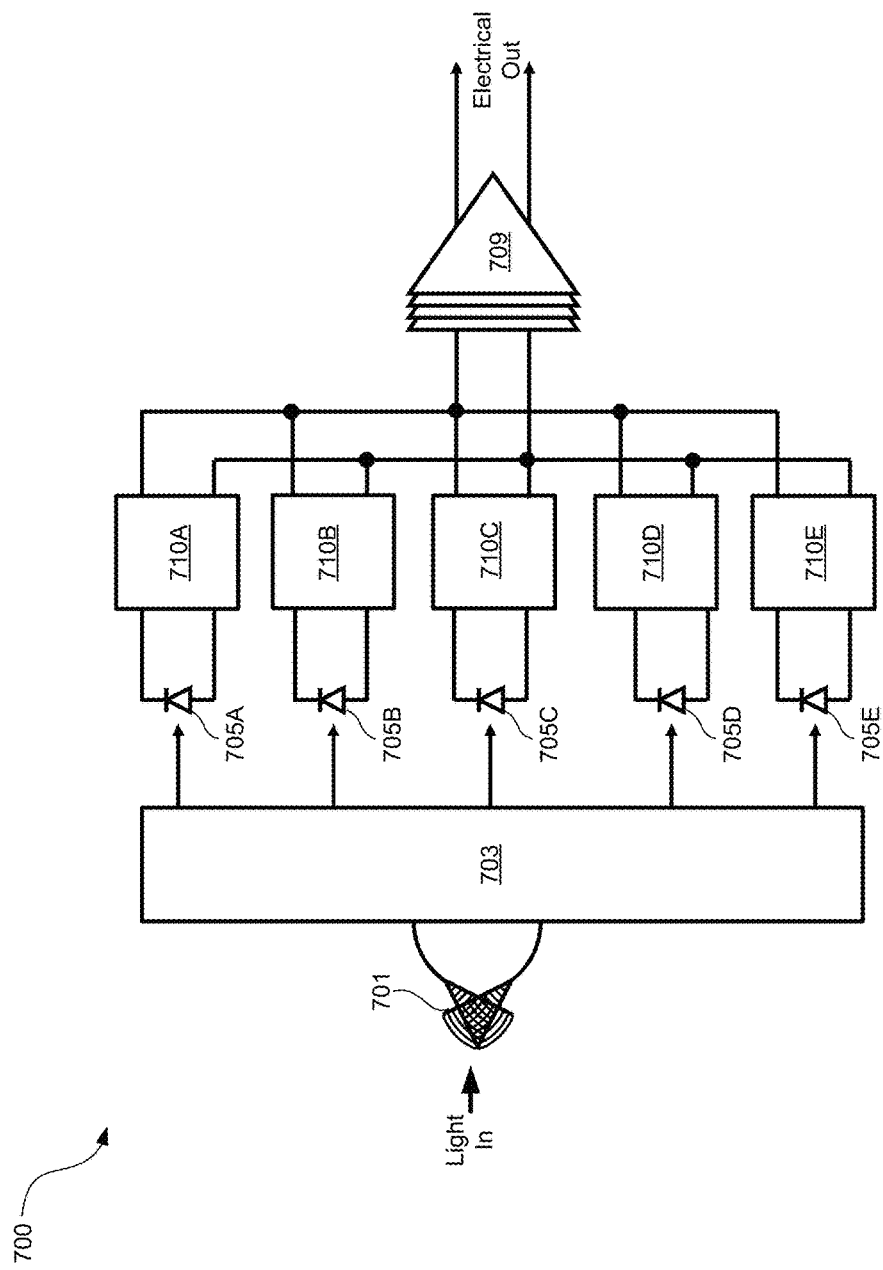
FIG. 7 illustrates an optical continuous time linear equalization circuit, in accordance with an example embodiment of the disclosure.

FIG. 7 illustrates an optical continuous time linear equalization circuit, in accordance with an example embodiment of the disclosure. Referring to FIG. 7, there is shown an optical continuous time linear equalization (CTLE) circuit 700 comprising a PSGC 701, splitter 703, photodiodes 705A-705E, distributed TIAs 710A-710E, and output gain stages 709. FIG. 7 may share any and all aspects of the structures of FIGS. 1-6, where the PSGC 701, photodiodes 705A-705E, TIAs 710A-710E, and gain stages 709 may be substantially similar to these structures described previously. In addition the splitter 703 may be similar to the splitters 404A and 404B, but with a different number of outputs.

The TIAs 710A-710E may each be tuned to a different frequency range, and the gain of each may be individually tuned to create a desired frequency response for the output signal Electrical Out. As with the structure of FIG. 4, the number of TIAs in the CTLE 700 is only an example, as any number of taps may be utilized depending on the desired frequency response. A controller, such as the control circuits of FIG. 1A, may configure the gain and feedback impedances of the TIAs 710A-710E.

Figure 8:
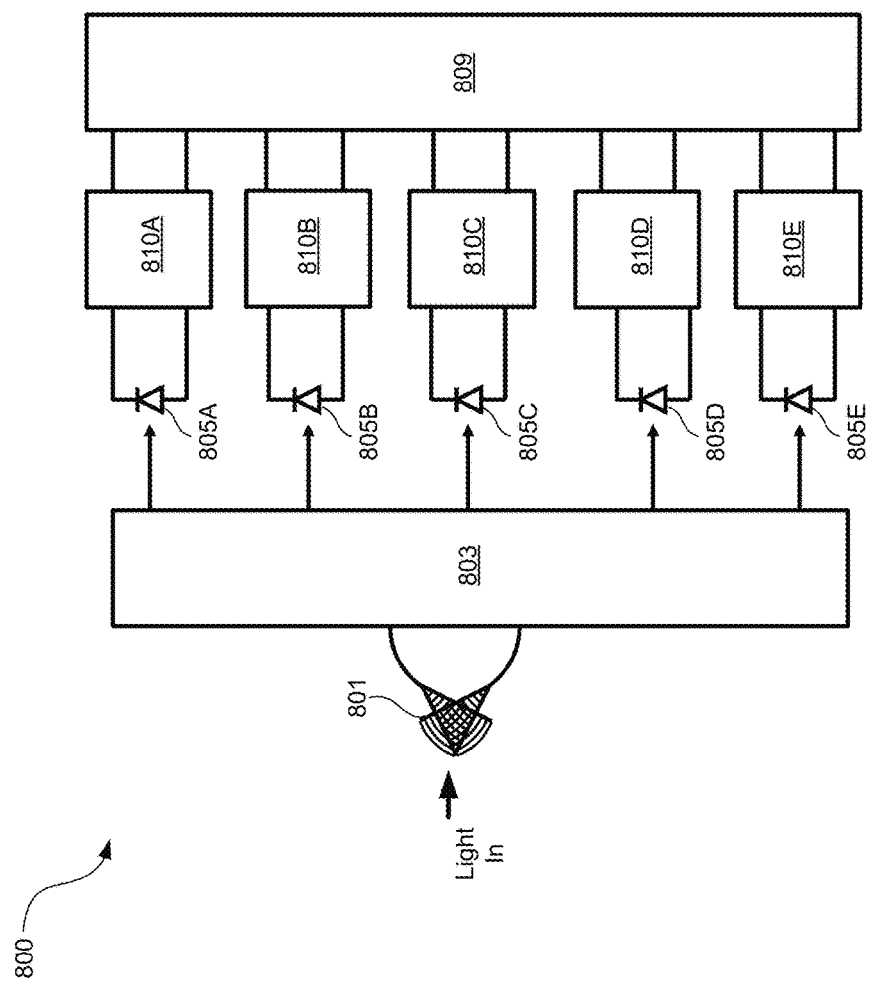
FIG. 8 illustrates an optical frequency discriminator, in accordance with an example embodiment of the disclosure.

FIG. 8 illustrates an optical frequency discriminator, in accordance with an example embodiment of the disclosure. Referring to FIG. 8, there is shown optical frequency discriminator 800 comprising a PSGC 801, splitter 803, photodiodes 805A-805E, distributed TIAs 810A-810E, and processor 809. FIG. 8 may share any and all aspects of the structures of FIGS. 1-7, where the PSGC 801, photodiodes 805A-805E, and TIAs 810A-810E may be substantially similar to these structures described previously.

The processor 809 may comprise suitable circuity, logic, and/or code that is operable to receive electrical signals from each of the TIAs 810A-810E and determine magnitudes of these signals. Each of the TIAs 810A-810E may be configured for a different frequency range across a desired frequency spectrum. Accordingly, the processor 809 may monitor each segment to discern modulated frequency content of the optical signal received by the PSGC 801. The frequency discrimination capability enabled by the structure of FIG. 8 may be utilized to configure filters elsewhere in the transceiver path, for example.

Figure 9:
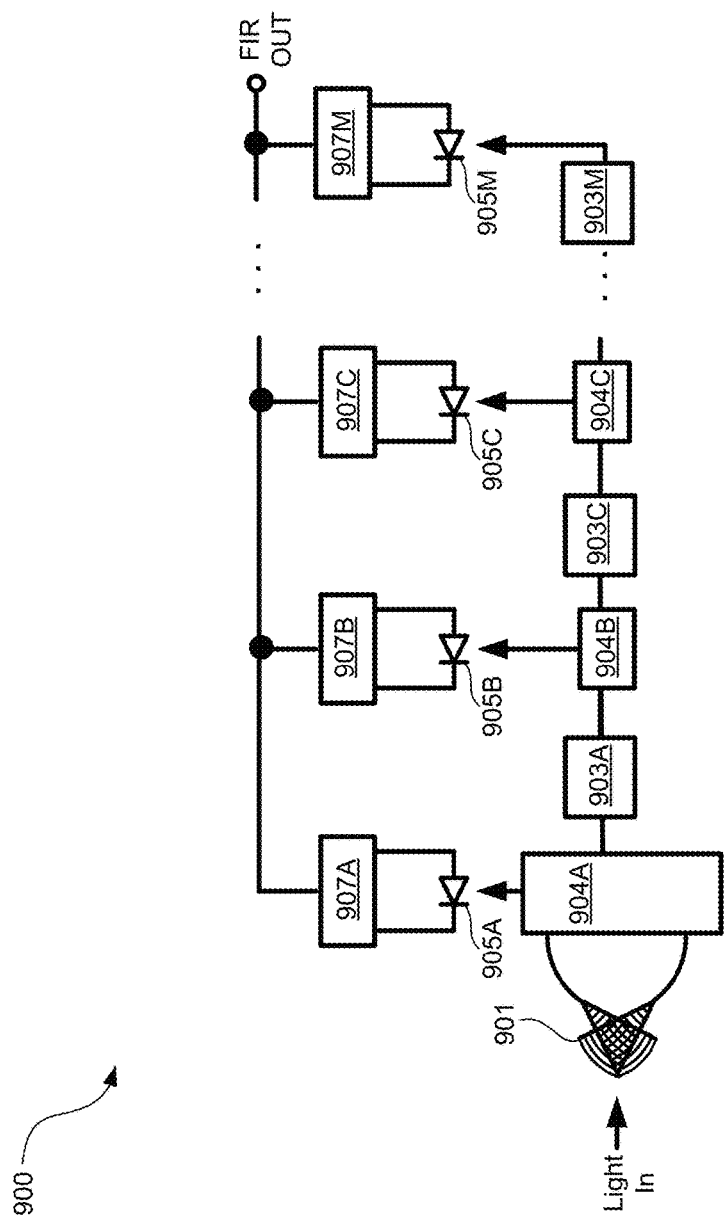
FIG. 9 illustrates an optical finite impulse response filter, in accordance with an example embodiment of the disclosure.

FIG. 9 illustrates an optical finite impulse response filter, in accordance with an example embodiment of the disclosure. Referring to FIG. 9, there is shown finite impulse response (FIR) filter 900 comprising a PSGC 901, optical delays 903A-903M, splitters 904A-904C, photodiodes 905A-905M, and distributed TIAs 907A-907M. FIG. 9 may share any and all aspects of the structures of FIGS. 1-8, where the PSGC 901, splitters 904A-904C, photodiodes 905A-905M, and TIAs 907A-907M may be substantially similar to these structures described previously. Furthermore, the diagram indicates that the number of stages may be any number, depending on the filter response desired and tolerable circuit complexity, for example, where more splitters, delay elements, photodiodes, and TIAs may be utilized.

The optical delays 903A-903M may comprise optical waveguide sections for example that provide a desired fixed or configurable time delay for optical signals traveling between stages. The splitters 904A-904C may be utilized to couple a portion of the optical signals of each polarization from the PSGC 901 to each photodiode 905A-905M. The FIR filter 900 may have multiple taps and TIAs with tunable gain levels, and the summing is again provided electrically at the outputs of the TIAs 907A-907M. In the example shown, one path is illustrated, although more may be similarly incorporated depending on input sources, with an FIR outputs, FIR OUT.

In an example embodiment, a method and system are disclosed for a distributed optoelectronic receiver. In this regard, aspects of the disclosure may comprise an optoelectronic receiver with a grating coupler, a splitter, a plurality of photodiodes, and a plurality of transimpedance amplifiers (TIAs). The optoelectronic receiver may receive a modulated optical signal utilizing the grating coupler, split the received signal into a plurality of optical signals, generate a plurality of electrical signals from the plurality of optical signals utilizing the plurality of photodiodes, communicate the plurality of electrical signals to the plurality of TIAs, amplify the plurality of electrical signals utilizing the plurality of TIAs, and generate an output electrical signal from coupled outputs of the plurality of TIAs. Each TIA may be configured to amplify signals in a different frequency range. One of the plurality of electrical signals may be DC coupled to a low frequency TIA of the plurality of TIAs. One of the plurality of electrical signals may be AC coupled to a high frequency TIA of the plurality of TIAs.

The plurality of TIAs may each have feedback impedances for configuring a frequency range of operation of each TIA. The plurality of photodiodes may be differentially coupled to the plurality of TIAs. The optoelectronic receiver may be operable to perform optical continuous linear equalization (CTLE) by configuring gain levels of each of the TIAs. The optoelectronic receiver may be operable to discriminate optical frequencies of the received signal based on magnitudes of output signals from each of the plurality of TIAs. The optoelectronic receiver may be operable to filter the received signal in a finite impulse response (FIR) filter comprising the plurality of photodiodes, the plurality of TIAs, and a plurality of optical delay elements. The optoelectronic receiver may be on a silicon complementary metal oxide semiconductor (CMOS) die.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y". As another example, "x, y, and/or z" means any element of the seven-element set $\{(x), (y), (z), (x, y), (x, z), (y, z), (x, y, z)\}$. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method for communication, the method comprising:
   in an optoelectronic receiver comprising a grating coupler, splitters, photodiodes, a processor, and transimpedance amplifiers (TIAs):
      receiving a modulated optical signal utilizing the grating coupler;
      splitting the received signal into a plurality of optical signals using the splitters;
      generating a plurality of electrical signals from the plurality of optical signals utilizing the photodiodes;
      communicating the plurality of electrical signals to the TIAs;
      amplifying the plurality of electrical signals utilizing the TIAs, wherein each TIA is configured to amplify signals in a different frequency range;
      discriminating, utilizing the processor, optical frequencies of the received signal based on magnitudes of output signals from each of the TIAs; and
      generating an output electrical signal from coupled outputs of the TIAs.

2. The method according to claim 1, comprising DC coupling one of the plurality of electrical signals to a low frequency TIA of the TIAs.

3. The method according to claim 1, comprising AC coupling one of the plurality of electrical signals to a high frequency TIA of the TIAs.

4. The method according to claim 1, wherein the TIAs each have feedback impedances for configuring a frequency range of operation of each TIA.

5. The method according to claim 1, wherein the photodiodes are differentially coupled to the plurality of TIAs.

6. The method according to claim 1, comprising performing optical continuous linear equalization (CTLE) by configuring gain levels of each of the TIAs.

7. The method according to claim 1, comprising discriminating optical frequencies of the received signal by monitoring the magnitudes of the output signals from each of the TIAs using the processor.

8. The method according to claim 1, wherein the optoelectronic receiver is on a semiconductor die.

9. The method according to claim 8, wherein the semiconductor die comprises a silicon complementary-metal oxide semiconductor (CMOS) photonics die.

10. A system for communication, the system comprising:
an optoelectronic receiver comprising a grating coupler, splitters, photodiodes, a processor, and transimpedance amplifiers (TIAs), the optoelectronic receiver being operable to:
receive a modulated optical signal utilizing the grating coupler;
split the received signal into a plurality of optical signals using the splitters;
generate a plurality of electrical signals from the plurality of optical signals utilizing the photodiodes;
communicate the plurality of electrical signals to the TIAs;
amplify the plurality of electrical signals utilizing the TIAs, wherein each TIA is configured to amplify signals in a different frequency range;
discriminate, utilizing the processor, optical frequencies of the received signal based on magnitudes of output signals from each of the TIAs; and
generate an output electrical signal from coupled outputs of the TIAs.

11. The system according to claim 10, wherein one of the plurality of electrical signals is DC coupled to a low frequency TIA of the TIAs.

12. The system according to claim 10, wherein one of the plurality of electrical signals is AC coupled to a high frequency TIA of the TIAs.

13. The system according to claim 10, wherein the TIAs each have feedback impedances for configuring a frequency range of operation of each TIA.

14. The system according to claim 10, wherein the photodiodes are differentially coupled to the plurality of TIAs.

15. The system according to claim 10, wherein the optoelectronic receiver is operable to perform optical continuous linear equalization (CTLE) by configuring gain levels of each of the TIAs.

16. The system according to claim 10, wherein the optoelectronic receiver is operable to discriminate optical frequencies of the received signal by monitoring the magnitudes of the output signals from each of the TIAs using the processor.

17. The system according to claim 10, wherein the optoelectronic receiver is on a silicon complementary metal oxide semiconductor (CMOS) die.

18. A system for communication, the system comprising:
an optoelectronic receiver comprising a grating coupler, a splitter, first and second photodiodes, a delay element, a first transimpedance amplifier (TIA) configured for low frequency operation, a processor, and a second TIA configured for high frequency operation, the optoelectronic receiver being operable to:
receive a modulated optical signal utilizing the grating coupler;
split the received signal into two optical signals;
delay one of the optical signals using the delay element;
generate two electrical signals from the two optical signals utilizing the two photodiodes;
communicate the two electrical signals to the first and second TIAs;
discriminate, utilizing the processor, optical frequencies of the received signal based on magnitudes of output signals from each of the TIAs;
amplify the two electrical signals utilizing the first and second TIAs;
and
generating an output electrical signal from coupled outputs of the first and second TIAs.

* * * * *